United States Patent
JangJian et al.

(10) Patent No.: US 9,349,902 B2
(45) Date of Patent: May 24, 2016

(54) SYSTEM AND METHOD FOR REDUCING IRREGULARITIES ON THE SURFACE OF A BACKSIDE ILLUMINATED PHOTODIODE

(75) Inventors: Shiu-Ko JangJian, Tainan (TW); Kei-Wei Chen, Tainan (TW); Chi-Cherng Jeng, Madou Township (TW); Min Hao Hong, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 13/486,833

(22) Filed: Jun. 1, 2012

(65) Prior Publication Data

US 2013/0320478 A1     Dec. 5, 2013

(51) Int. Cl.
*H01L 31/00*     (2006.01)
*H01L 31/103*     (2006.01)
*H01L 29/36*     (2006.01)
*H01L 31/18*     (2006.01)

(52) U.S. Cl.
CPC .......... *H01L 31/103* (2013.01); *H01L 31/1037* (2013.01); *H01L 31/1812* (2013.01); *H01L 29/36* (2013.01); *H01L 31/18* (2013.01); *Y02E 10/50* (2013.01)

(58) Field of Classification Search
CPC .............. H01L 31/103; H01L 31/1812; H01L 31/1037; H01L 29/36; H01L 31/18
See application file for complete search history.

(56) References Cited

U.S. PATENT DOCUMENTS

| | | | |
|---|---|---|---|
| 6,077,733 A * | 6/2000 | Chen et al. | 438/182 |
| 6,225,211 B1 * | 5/2001 | Tsui | 438/624 |
| 6,759,730 B2 | 7/2004 | Chaudhry et al. | |
| 2007/0210395 A1 * | 9/2007 | Maruyama et al. | 257/431 |
| 2008/0079108 A1 * | 4/2008 | Hsu et al. | 257/460 |
| 2009/0027371 A1 | 1/2009 | Lin et al. | |
| 2012/0319169 A1 | 12/2012 | Van Hove | |

FOREIGN PATENT DOCUMENTS

KR     20030024626 A     3/2003

* cited by examiner

*Primary Examiner* — Caleb Henry
*Assistant Examiner* — Alexander Belousov
(74) *Attorney, Agent, or Firm* — Slater Matsil, LLP

(57) ABSTRACT

System and method for processing a semiconductor device surface to reduce dark current and white pixel anomalies. An embodiment comprises a method applied to a semiconductor or photodiode device surface adjacent to a photosensitive region, and opposite a side having circuit structures for the device. A doped layer may optionally be created at a depth of less than about 10 nanometers below the surface of the substrate and may be doped with a boron concentration between about 1E13 and 1E16. An oxide may be created on the substrate using a temperature sufficient to reduce the surface roughness below a predetermined roughness threshold, and optionally at a temperature between about 300° C. and 500° C. and a thickness between about 1 nanometer and about 10 nanometers. A dielectric may then be created on the oxide, the dielectric having a refractive index greater than a predetermined refractive threshold, optionally at least about 2.0.

20 Claims, 4 Drawing Sheets

SYSTEM AND METHOD FOR REDUCING IRREGULARITIES ON THE SURFACE OF A BACKSIDE ILLUMINATED PHOTODIODE

BACKGROUND

Damage to silicon making up semiconductor devices, such as photodiodes, is a well known phenomenon creating noise and other inaccuracies in image acquisition devices. Damage to the crystalline structure of a semiconductor can cause dark current and white pixel distortion in photodiode operation by altering the structure of the silicon in the photodiode. In photodiodes, silicon damage may cause the photodiode to improperly promote spurious electrons not associated with photoreactivity. Such spurious electrons cause a photodiode to register a light reading, even when no light has caused the promotion of an electron. Thus, semiconductor damage can cause inaccuracies in a photodiode's sensing of light by inaccurately reflecting the actual amount of light sensed by the photodiode, introducing noise into an image. Dark current is current generated without light, while a white pixel defect is damage to, or overloading of a photodiode by excess dark current, causing the photodiode to always read as if it had sensed a pure white light, when it had not.

Photodiodes such as complimentary metal oxide semiconductors (CMOS) diodes are commonly used for sensing images in cameras and other video or photo devices. Recently, photodiode devices have been improved by using backside illumination (BSI). Generally, photolithography processes deposit structures such as gate oxides, metal interconnects, and the like, on the top side of silicon wafer or other substrate. Early photodiodes gathered light from the top, the same side where the device structures were applied. Metal interconnects deposited on the top surface of the photodiode substrate can block portions of the photosensitive regions of the photodiode, degrading the picture quality and individual photodiode sensitivity. BSI is the collection of light from the backside of the photodiode substrate, with interfering structures such as metal interconnects, gate oxides or the like deposited onto the top side of the substrate, and then the substrate abraded or otherwise thinned to allow light to pass though the substrate and affect the photosensitive region of the photodiode. Ideally the substrate thickness is reduced so that light may enter the backside of the device and strike the photosensitive region of the photodiode, eliminating obstruction and interference during image capture from deposited structures and metal interconnects.

Frequently, the thinning of a photodiode to permit BSI operation is done through chemical mechanical polishing. However, on a sub-nanometer scale the surface of even a highly polished substrate may have irregularities, crystal deformities, or the like, resulting dangling electron bonds. The loosely bound dangling electronics can lead to instances of dark current and white pixel conditions. Thus, reductions in surface irregularities resulting in reduced dark current and white pixel anomalies and more accurate imaging devices.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
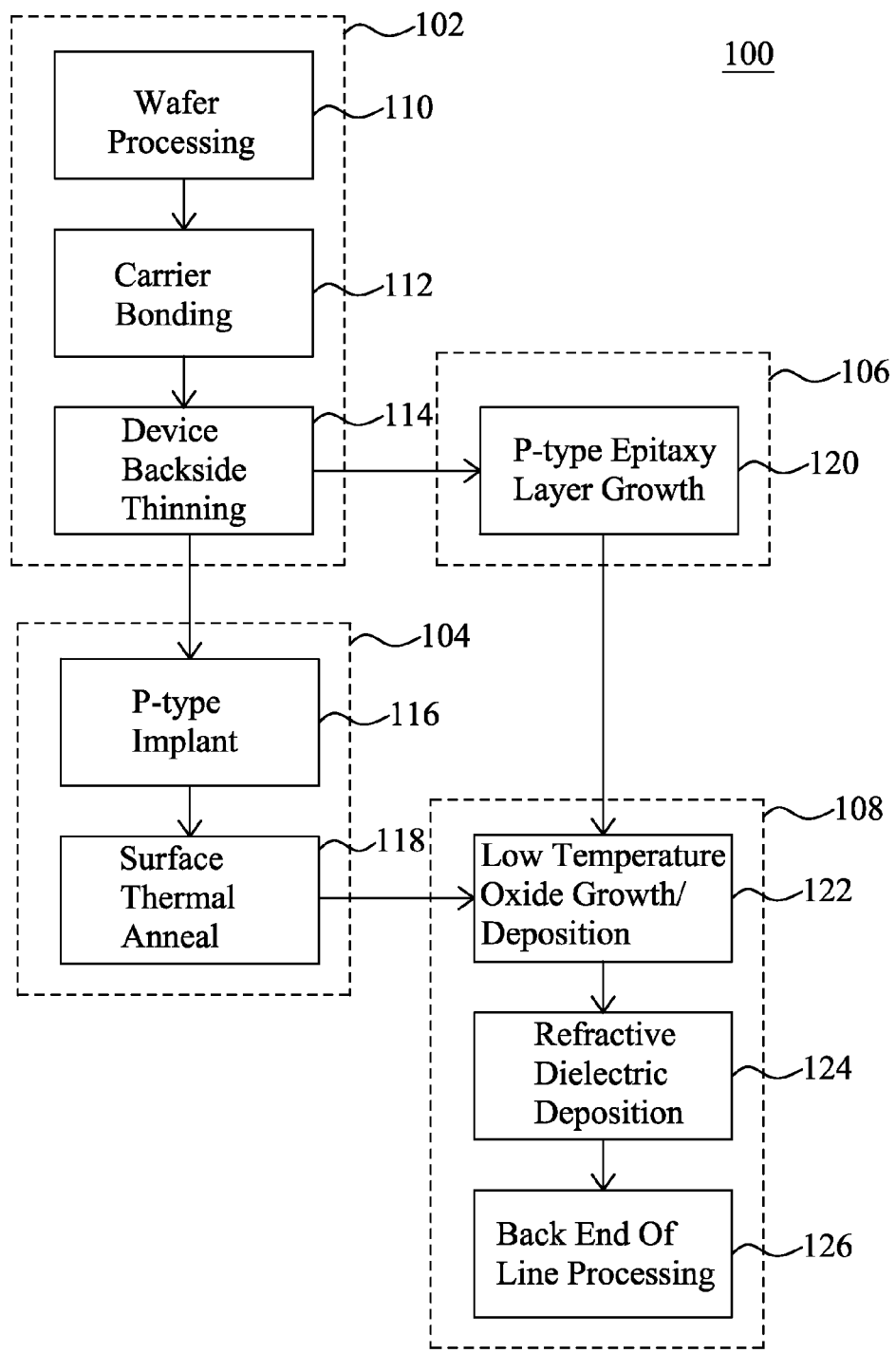
FIG. 1 is a flow diagram illustrating a method for processing a photodiode according to the presented principles.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

The present principles are directed to a device, and method for making a device, having reduced dark current and white pixel characteristics and a high refractive index dielectric layer. In particular, a method is presented herein that is directed to improving the surface characteristics of semiconductors and photodiodes in particular.

A method is disclosed herein for processing a semiconductor or photodiode device to reduce dark current and white pixel, and which may be applied to a device surface with an adjacent photosensitive region, and opposite the circuit structures for the device. A doped layer may optionally be created in the substrate at about the substrate surface. The doped layer may be doped with boron to a dopant concentration between about 1E13 to about 1E16, and to a depth of less than about 10 nanometers. An oxide may also be created on the surface of the substrate by using a temperature sufficient to reduce the substrate surface roughness below a predetermined roughness threshold, and optionally less than about 0.11 nanometers. The oxide may optionally be formed at a temperature between about 300° C. and 500° C. and a thickness between about 1 nanometer and about 10 nanometers. A dielectric may then be created on the oxide, the dielectric having a refractive index greater than a predetermined refractive threshold, and optionally at least about 2.0. Additionally, a passivation layer may be applied over the dielectric.

The method results in a semiconductor or photodiode device with a substrate optionally having a doped p-type layer. In the case of a photodiode, the device may be constructed so that the device is backside illuminated. The p-type layer may be an epitaxial layer of silicon-germanium, or formed by implanting a dopant and performing a surface thermal anneal on the substrate surface. A low temperature oxide, optionally having a thickness between about 1 nanometer and about 10 nanometers, may be disposed the substrate and may have formed at a temperature sufficient to reduce the roughness of the substrate surface below a predetermined threshold, which will preferably be less than about 0.11 nanometers. A dielectric cap, optionally with a thickness between about 100 nanometers and about 150 nanometers, may also be disposed on the first oxide and have a refractive index above the predetermined threshold, which may preferably be 2.0.

Embodiments will be described with respect to a specific context, namely a system and method for fabricating a photodiode device with enhanced dark current and white pixel resistance. Other embodiments may also be applied, however, to other devices, including, but not limited to solar cells, light emitting diodes, and the like.

With reference now to FIG. 1, a flow diagram illustrating a method 100 for processing a photodiode device according to the presented principles is depicted. The method 100 is described with reference to the cutaway diagrams of FIGS. 2-7, which are drawn for illustrative purposes, and are not to scale.

Block 102 refers to a procedure for preparing a photodiode for active surface correction. Block 104 is an optional procedure for implanting a p-type layer into the active surface of the photodiode, while block 106 is an optional procedure for applying a p-type layer on the active photodiode surface via epitaxial growth. Block 108 is a procedure for surface correction and finishing.

Initially, in block 102 a photodiode is constructed and processed for use as a BSI photodiode 216. While the principles presented herein are described herein as being applied to a photodiode for clarity, skilled practitioners will recognize that the presented principles are not limited to a single photodiode, and may be used for wafer or chip level fabrication, or any other processing system.

Figure 2:
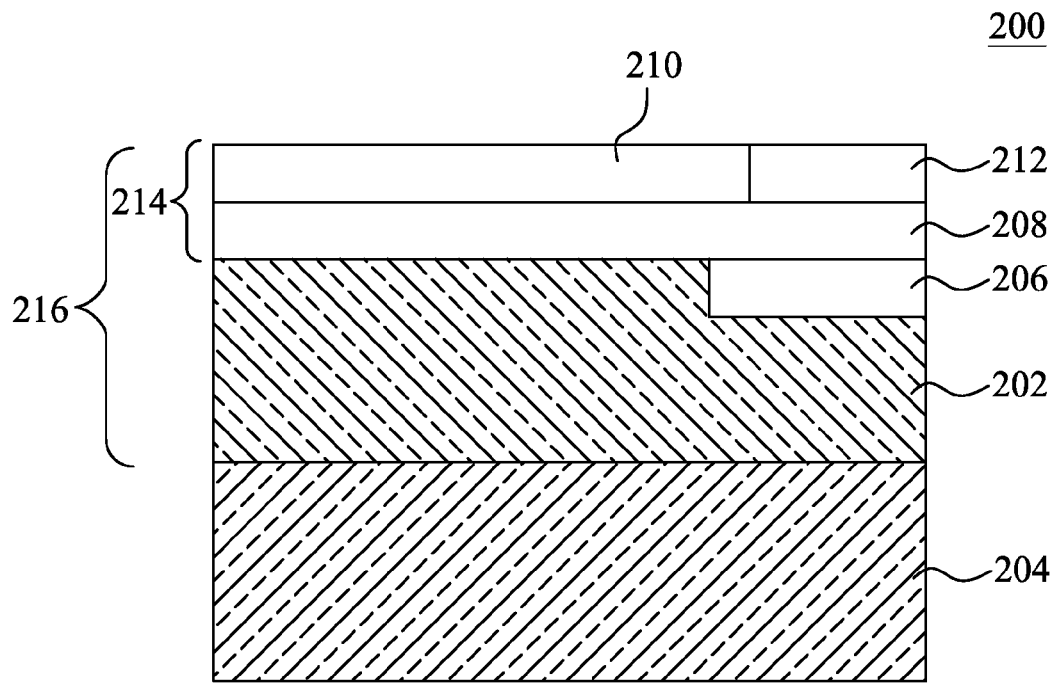
FIG. 2 is a cross-sectional view of a photodiode during BSI structure processing.

FIG. 2 illustrates a cross-sectional view of a photodiode during BSI structure processing 200. A photodiode 216 has a photosensitive region 202 that may include, but are not limited to or requiring, device circuit features 214 such as shallow trench isolation (STI) structures 206, interlayer dielectric layers 208, metal interconnects 212, intermetal dielectric layers 210, and the like. Skilled practitioners will recognize that the structure of the BSI photodiode 216 may be varied according to the requirements of a design or based on new or as yet undiscovered fabrication techniques.

The photodiode 216 may also have a bulk substrate 204 of a wafer from which the photodiode was fabricated. Photodiodes 216 are frequently fabricated from material thicker than necessary, with the thicker wafer substrate supporting the photodiode 216 during fabrication. In the case of a BSI photodiode 216, the excess bulk substrate 204 may be removed after photodiode 216 fabrication to thin the material enough to permit photons to pass through the thinned backside of the substrate and be absorbed by the photosensitive region 202.

Figure 3:
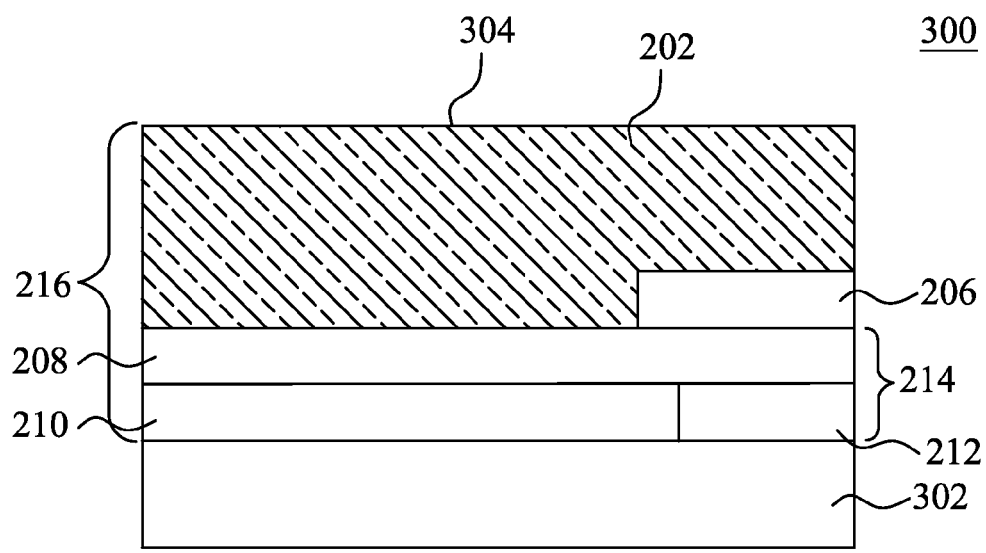
FIG. 3 is a cross-sectional view of a photodiode with carrier and active surface.

The photodiode 216 may, in block 112 be bonded at the top, or circuit side, to a carrier 302 or other support structure, with the bulk substrate 204 removed in block 114 by backside thinning. FIG. 3 is a cross sectional view of the photodiode 216 with a carrier 302 and active surface 304 exposed 300.

While the supported photodiode 216 is described as being bonded to a carrier 302, any suitable support structure may be advantageously employed. For example, in one embodiment, the photodiode 216 may be mounted on a carrier wafer for later singulation and packaging, or may be mounted in a package or on a temporary carrier and debonded in a later step. Alternatively, a photodiode 216 may be processed without a supporting carrier 302, with such option being determined by the requirements of the subsequent processing steps.

Removal of the bulk substrate 204 leaves an active surface 304 opposite the circuit side of the photodiode 216. That is, the active surface of the photodiode 216 is a surface through which photons enter the photosensitive region 202 of the photodiode, resulting free carriers in the photosensitive region 202. Typically, this bulk substrate 204 removal maybe accomplished via a chemical mechanical polish (CMP), but may also be advantageously accomplished though etching, shearing, or the like. However, removal of the bulk substrate 204 from the photosensitive region 202 by a physical process may cause surface roughness and discontinuities in the substrate's crystalline structure, resulting in defects and dangling bonds at the active surface 304 of the photodiode 216. These defects and dangling bonds can result in noise and inaccurate readings as a result of dark current or white pixel anomalies during image acquisition by the photodiode 216. The resulting active surface 304 would ideally, be planar, with a roughness of 0, indicating a uniform crystalline surface and no dangling bonds.

Figure 4:
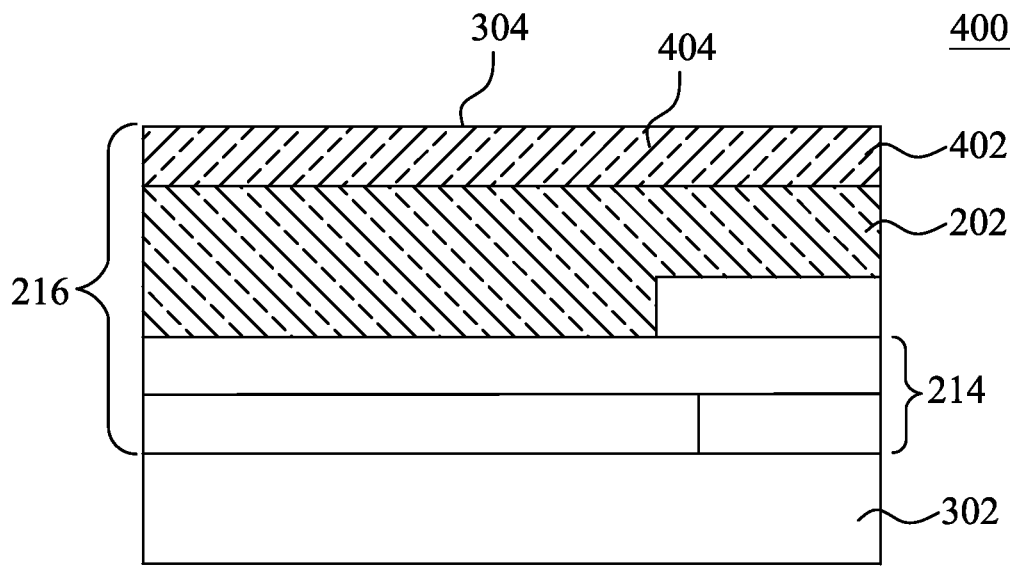
FIGS. 4-6 are cross-sectional views of a photodiode in intermediate states of active surface processing according to the present principles.

A p-type layer 404 may optionally be applied to the active surface of the photodiode 216 via implant and anneal, as shown in block 104 or via epitaxy as shown in block 106. The deposited p-type layer 404 and resulting p-type layer to photodiode interface 402 is illustrated in FIG. 4, and is disposed opposite the carrier 302, and below the active surface 304 on the photodiode 216. The implant process of block 104 may comprise an implant of a p-type dopant, shown in block 116, and a surface thermal anneal, shown in block 118. A boron (B) dopant may be advantageously used as the p-type dopant, and provided by boron ions, boron diflouride ($BF_2$), diborane ($C_2H_6$) or the like. Alternatively, any acceptor, or p-type dopant may be used depending on the requirements of the device, including, but not limited to, aluminum (Al), indium (In), gallium (Ga) or the like. In particularly useful embodiments of an ion implantation embodiment, the active surface 304 may be doped with a boron concentration between about $1\text{E}13$ to about $1\text{E}15$. A gaussian doping distribution at a depth of less than about 10 nm may also be advantageously employed, but may be varied to suit device requirements.

Ion implantation may create many point defects in the target crystal on impact such as vacancies and interstitials. Vacancies are crystal lattice points unoccupied by an atom. In this case the ion collides with a target atom, resulting in transfer of a significant amount of energy to the target atom such that it leaves its crystal site. Interstitials result when such atoms (or the original ion itself) come to rest in the solid, but find no vacant space in the lattice to reside. A surface thermal anneal, as in block 118, may be used to repair the damage to the crystalline structure introduced by the ion implantation. A rapid thermal anneal (RTA) may be used, or alternatively, a local laser anneal may be used, which may limit migration of the surface dopant layer or reduce use of the photodiode's 216 thermal budget.

Alternatively, in the epitaxial growth process of block 106, a p-type layer 404 is deposited or grown via epitaxy in block 120, and may, in one embodiment, use a silicon-germanium precursor with a germanium concentration about 10%-20% and boron dopant to form a boron doped SiGe epitaxial layer 404. One useful embodiment may be where an epitaxial layer is deposited less than about 10 nm thick, with a boron concentration of between about $1\text{E}13$ and about $1\text{E}16$. Any suitable process may be used for the epitaxy process, including, but not limited to, vapor-phase epitaxy (VPE), molecular beam epitaxy (MBE), liquid-phase epitaxy (LPE) or the like. A SiGe epitaxy layer process 106 may, in some embodiments, provide greater control over layer thickness, doping concentration and process control without the need for surface annealing when compared to the ion implantation process 104.

Figure 5:
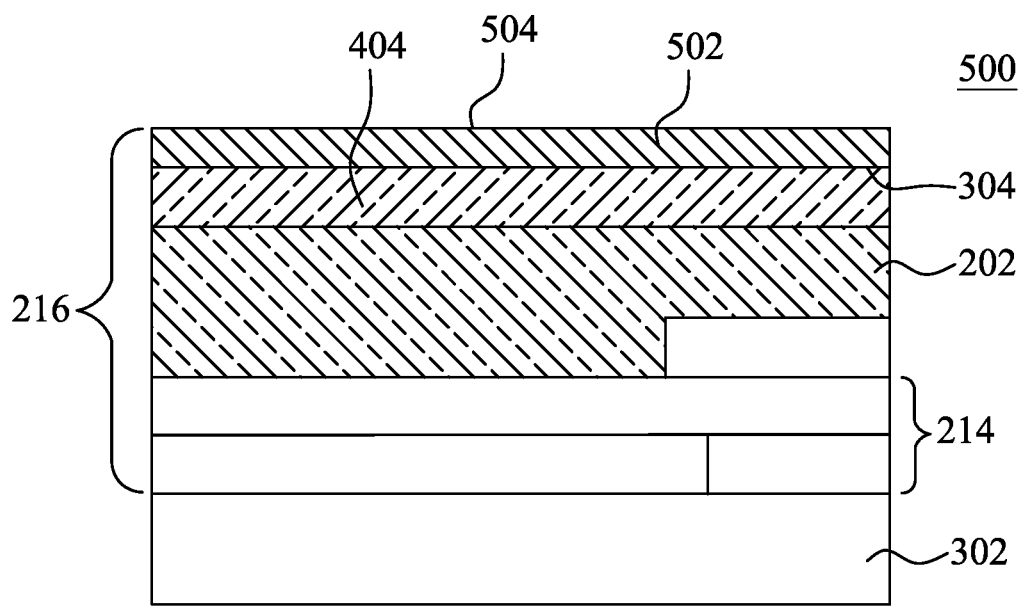

The surface correction and finishing procedure of block 108 may be applied to the active surface 304 over the p-type layer 404, where such a layer is applied, or directly on the photodiode's 216 photosensitive region 202 where no p-type layer 404 is deposited. Initially, a low temperature oxide 502 maybe grown or deposited in block 122 on the active surface 304. A photodiode with oxide 500 is depicted in FIG. 5, the deposition of the oxide 502 resulting in a top oxide surface 504 opposite the circuit side of the photodiode 216. An oxide 502 grown on the active surface 304 may be between about 1 nm and 10 nm, and will most preferably be between about 1 nm and 3 nm. Additionally, the oxide 502 may, in some embodiments, be a silicon oxide, for silicon based photodiodes, or may be any other suitable oxide, particularly when the photodiode 216 uses a substrate other than silicon. Additionally, a low temperature oxide, particularly one grown between about 300° C. and 500° C. reduces the roughness of the active surface 304 between the oxide 502 and photodiode's 216 photosensitive region 202 or p-type layer 404 where applicable. In particularly useful embodiments, the low temperature oxide 502 will be grown at a temperature sufficient to reduce the active surface 304 roughness below a predetermined threshold, which may preferably be less than about 0.11 hm. An oxide growth temperature of about 420° C. give fairly rapid oxide growth with sufficient surface defect correction. Ideally, the surface roughness of the active surface 304 will be 0 nm—that is, a surface that is smooth at the microscopic level. The 420° C. oxide growth temperature has been observed to result in surface defects, or a surface roughness, less than about 0.11 nm. Testing indicates that higher temperature will grow an oxide, but that high temperature oxide temperatures correct the photodiode's 216 surface defects less than a low temperature oxide, leaving a greater active surface 304 roughness.

A dielectric layer or cap 602 having a high refractive index may advantageously be applied over the oxide 502 in block 124. The dielectric cap 602 and oxide 502 will both, preferably, be configured to permit at least predetermined wavelengths of light or other electromagnetic energy to pass through and reach the photosensitive region 202 of the photodiode 216. The optical properties of the dielectric cap 602 and oxide may be selected based on the desired device requirements and properties of the photodiode 216. For example, an infrared photodiode will preferably be most sensitive to infrared wavelength of electromagnetic radiation, and therefore, the dielectric cap 602 and oxide will have high transmissivity of infrared radiation.

Figure 6:
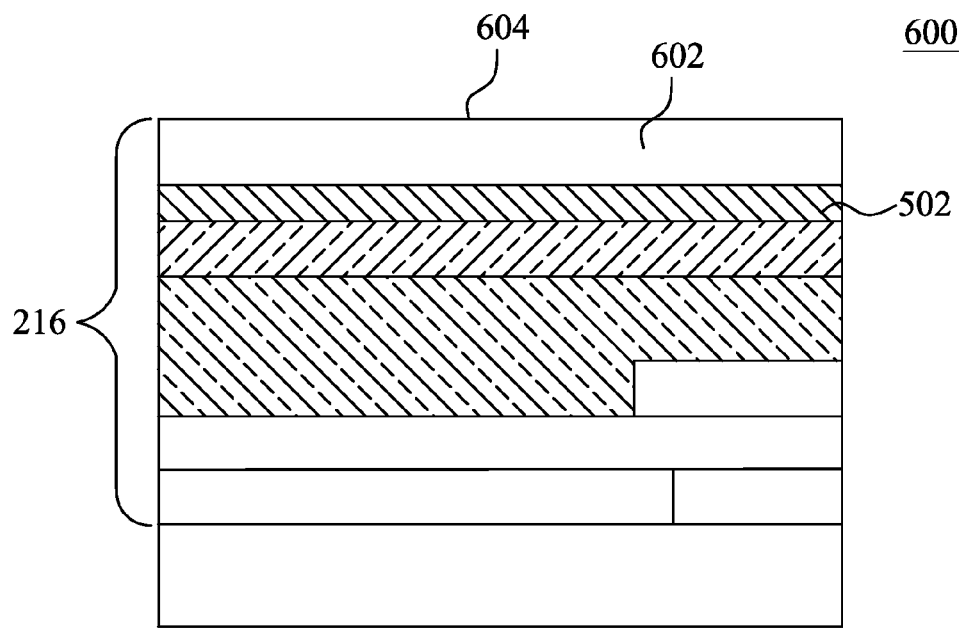

The dielectric layer or cap 602 may be deposited on the surface of the oxide 504 as depicted in FIG. 6 to create a capped photodiode 600 with a dielectric cap surface 604 exposed for further processing. The overall index of refraction for a dielectric 602 material is comprised of the refractive index (n) and the extinction coefficient (k). The refractive index n indicates the phase speed of an electromagnetic wave passing through a material while the extinction coefficient k indicates the amount of absorption loss experienced by an electromagnetic wave propagating through the material. A preferred refractive dielectric will have an extinction coefficient k as close to 0 as possible, corresponding a material absorbing none of, or transmitting all of, a wave's energy as it passes through the material. Preferred dielectric materials will also have a refractive index n above a predetermined refractive threshold, and most preferably over 2.0. A higher refractive index n which tends to give greater quantum efficiency in the photodiode's 216 photosensitive region 202. That is, a photodiode 216 with higher quantum efficiency will convert more incoming electromagnetic energy into electric current, resulting in a more sensitive and accurate device.

Possible dielectric materials may include, but are not limited to, silicon dioxide ($SiO_2$), silicon nitride ($Si_3N_4$), silicon carbide (SiC) or the like. Additionally, in one embodiment, the dielectric cap 602 will have a thickness between about 80 nm and about 250 nm, and will preferably have a thickness between about 100 nm and about 150 nm. Notably, a silicon oxide dielectric cap 602 may be used, and may be grown or deposited at higher temperatures than the low temperature oxide 502, since the photodiode surface 304 will have already have been repaired by the low temperature oxide 502 layer creation. Additionally, in one particularly useful embodiment, the dielectric cap 602 may have multiple layers, and may also act as an antireflective coating to further increase the quantum efficiency of the photodiode 216. In such a multilayer embodiment, the dielectric cap 602 may preferably comprise a silicon dioxide layer with an overlying silicon nitride layer.

Figure 7:
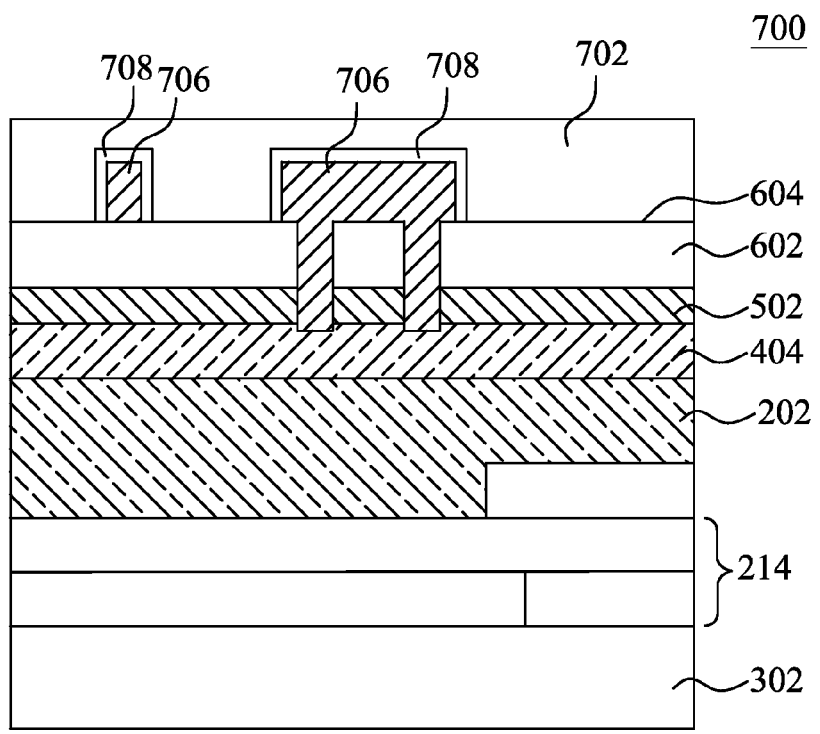
FIG. 7 is a cross-sectional view of a photodiode with after additional back end of line processing.

Additional back end of line processing may be performed in block 126. FIG. 7 illustrates a photodiode 216 with optional surface or back end of line processing 700. In such back end processing, passivation layers 702, metal lines 706, or barrier films 708 may for example, be deposited on the surface 604 of the dielectric cap 602. Furthermore, features such as antireflective coatings, microlenses, filters, or the like, may also be applied to the passivation layer 702 surface 704.

Although the present embodiments and their advantages have been described in detail, it should be understood that various changes, substitutions and alterations can be made herein without departing from the spirit and scope of the disclosure as defined by the appended claims. For example, some final back end processing or p-type layer creation processes may be eliminated of performed in a different order without deviating from the spirit of the presented principles Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for processing a semiconductor comprising:
   providing a semiconductor device having a substrate with a first surface, the first surface a result of a reduction of the substrate;
   creating a doped layer in the substrate at about the first surface of the substrate;
   performing a low temperature oxide deposition process, the low temperature oxide deposition process growing a first oxide on the first surface of the substrate and reducing a roughness of the first surface below a predetermined roughness threshold; and
   creating a dielectric layer on a surface of the first oxide, the dielectric layer being continuous and having a uniform thickness, the dielectric layer contacting the first oxide and having a refractive index greater than a predetermined refractive threshold, and the dielectric layer having a multi-layered structure comprising a first layer and a second layer different from the first layer.

2. The method of claim 1, wherein the semiconductor device has a photosensitive region in the substrate adjacent to the first surface and a circuit side opposite the first surface.

3. The method of claim 1, wherein the first oxide is created at a temperature between about 300° C. and 500° C. and created to have a thickness between about 1 nanometer and about 10 nanometers.

4. The method of claim 1, wherein the doped layer is a p-type layer doped with boron.

5. The method of claim 4, wherein the doped layer has a dopant concentration between about 1E13 to about 1E16, and wherein the doped layer is less than about 10 nanometers deep.

6. The method of claim 4, wherein the creating the p-type layer comprises implanting a dopant through the first surface of the substrate and performing a surface thermal anneal on the first surface of the substrate.

7. The method of claim 4, wherein the p-type layer is epitaxially grown.

8. The method of claim 1, wherein the dielectric layer comprises a material selected from the group consisting essentially of silicon nitride, silicon carbide and silicon dioxide.

9. The method of claim 1, wherein the first layer is a silicon nitride layer and the second layer is a silicon dioxide layer, with the first layer overlying the second layer.

10. A method comprising:
providing a substrate having a photodiode formed at a circuit side of the substrate, the photodiode having a photosensitive region disposed in the substrate, the substrate further having a shallow trench isolation region (STI) extending from the circuit side of the substrate into the substrate;
reducing a thickness of the substrate by removing a portion of the substrate at a back side of the substrate opposite the circuit side while the photosensitive region is disposed in the substrate;
growing a low temperature oxide through a low temperature process on the back side of the substrate and at a first temperature to reduce a roughness of the back side below a predetermined roughness threshold;
forming a dielectric cap directly on the low temperature oxide at a second temperature greater than the first temperature, a material of the dielectric cap having a refractive index above a predetermined refractive index threshold, the dielectric cap contacting the low temperature oxide; and
forming a conducive feature over the dielectric cap, the conductive feature extending into the dielectric cap and the low temperature oxide.

11. The method of claim 10, wherein the reducing the thickness of the substrate comprises removing a portion of the substrate that is disposed at the back side of the substrate and over the photosensitive region.

12. The method of claim 10, wherein the predetermined roughness threshold is about 0.11 nanometers.

13. The method of claim 10, wherein the material of the dielectric cap has a refractive index of at least about 2.0.

14. The method of claim 10, wherein the dielectric cap has a thickness between about 100 nanometers and about 150 nanometers.

15. The method of claim 10, wherein the low temperature oxide has a thickness between about 1 nanometer and about 10 nanometers.

16. A method comprising:
providing a substrate having photosensitive region adjacent to a first side and having a circuit side opposite the first side, wherein the first side of the substrate has a first roughness;
forming a p-type region at the first side of the substrate;
after the forming the p-type region, performing a low temperature oxide growth process to grow a low temperature oxide on the first side of the substrate, wherein the low temperature oxide growth process is performed at a first temperature sufficient to reduce the roughness of the first side to a second roughness that is below a predetermined roughness threshold and less than the first roughness;
forming a dielectric cap on the low temperature oxide at a second temperature greater than the first temperature, a material of the dielectric cap having a refractive index above a predetermined refractive index threshold, the dielectric cap having a substantially flat bottom surface in direct contact with the low temperature oxide;
forming a metal line directly on the dielectric cap, a portion of the metal line extends through the dielectric cap and the low temperature oxide; and
forming a passivation layer on the dielectric cap and over the metal line.

17. The method of claim 16, wherein the low temperature oxide is formed at a temperature between about 300° C. and 500° C.

18. The method of claim 16, wherein the roughness threshold is about 0.11 nanometers.

19. The method of claim 16, wherein the portion of the metal line extends below an upper surface of the p-type region, with the upper surface extending away from the substrate.

20. The method of claim 16, further comprising:
before the forming the passivation layer, forming a barrier layer on the metal line.

* * * * *